United States Patent
Bean et al.

(10) Patent No.: US 7,701,991 B2
(45) Date of Patent: Apr. 20, 2010

(54) HIGH-POWER INFRARED SEMICONDUCTOR DIODE LIGHT EMITTING DEVICE

(75) Inventors: David M. Bean, Middleton, MA (US); Yi Qian, Acton, MA (US); Daniel E. Pulver, North Reading, MA (US)

(73) Assignee: SemiNex Corporation, Peabody, MA (US)

( * ) Notice: Subject to any disclaimer, the term of this patent is extended or adjusted under 35 U.S.C. 154(b) by 934 days.

(21) Appl. No.: 11/233,494

(22) Filed: Sep. 22, 2005
(Under 37 CFR 1.47)

(65) Prior Publication Data
US 2007/0002915 A1 Jan. 4, 2007

Related U.S. Application Data

(60) Provisional application No. 60/612,112, filed on Sep. 23, 2004.

(51) Int. Cl.
*H01S 3/04* (2006.01)
*H01S 3/14* (2006.01)
*H01L 31/00* (2006.01)

(52) U.S. Cl. .......... 372/43.01; 372/39; 372/34; 257/14

(58) Field of Classification Search ............ 372/39, 372/43.01; 257/14
See application file for complete search history.

(56) References Cited

U.S. PATENT DOCUMENTS

| | | | |
|---|---|---|---|
| 5,070,510 A * | 12/1991 | Konushi et al. | 372/46.01 |
| 5,311,046 A | 5/1994 | Mihashi | |
| 5,381,434 A * | 1/1995 | Bhat et al. | 372/45.011 |
| 5,521,935 A | 5/1996 | Irikawa | |
| 5,541,949 A * | 7/1996 | Bhat et al. | 372/45.011 |
| 5,771,256 A | 6/1998 | Bhat | |
| 5,818,630 A | 10/1998 | Fermann et al. | |
| 5,920,079 A * | 7/1999 | Shimizu et al. | 257/18 |
| 5,952,673 A | 9/1999 | Higashi et al. | |
| 6,020,604 A | 2/2000 | Kikkawa | |
| 6,931,044 B2 * | 8/2005 | Bour et al. | 372/46.01 |
| 7,184,640 B2 * | 2/2007 | Bour et al. | 385/129 |

(Continued)

FOREIGN PATENT DOCUMENTS

EP 0 651 478 A1 5/1995

OTHER PUBLICATIONS

Zah, Chung-En, et al., "High-Performance Uncooled 1.3-µm AlxGayIn1-x-yAs/InP Strained-Layer Quantum-Well Lasers for Subscriber Loop Applications," IEEE Journal of Quantum Electronics, vol. 30, No. 2, Feb. 1994, pp. 511-523.

(Continued)

*Primary Examiner*—Minsun Harvey
*Assistant Examiner*—Phillip Nguyen
(74) *Attorney, Agent, or Firm*—Houston Eliseeva LLP (57) ABSTRACT

A semiconductor laser diode using the aluminum gallium, arsenide, gallium indium arsenide phosphide, indium phosphide, (AlGaInAs/GaInAsP/InP) material system and related combinations is disclosed. Both the design of the active layer and the design of the optical cavity are optimized to minimize the temperature rise of the active region and to minimize the effects of elevated active layer temperature on the laser efficiency. The result is a high output power semiconductor laser for the wavelengths between 1.30 and 1.61 micrometers for the pumping of erbium doped waveguide devices or for direct use in military, medical, or commercial applications.

24 Claims, 6 Drawing Sheets

U.S. PATENT DOCUMENTS 7,218,658 B2 * 5/2007 Takagi ................. 372/43.01
2005/0100066 A1 * 5/2005 Reid ...................... 372/43

OTHER PUBLICATIONS

Labudovic, Marko, et al., "Heat Transfer and Residual Stress Modeling of a Diamond Film Heat Sink for High Power Laser Diodes," IEEE Transactions on Components and Packaging Technologies, vol. 26, No. 3, Sep. 2003, pp. 575-581.

Selmic, Sandra R., et al., "Design and Characterization of 1.3-μm AlGaInAs-InP Multiple-Quantum-Well Lasers," IEEE Journal on Selected Topics in Quantum Electronics, vol. 7, No. 2, Mar./Apr. 2001, pp. 340-349.

Zhang, Yejin, et al., "Design of the Active Structure of High-Performance 1.55-μm $In_{1-x-y}Ga_yAl_x$ As Strained MQW Lasers," IEEE Journal of Quantum Electronics, vol. 37, No. 7, Jul. 2001, pp. 923-927.

Ishikawa, T., et al., "Well-Thickness Dependence of High-Temperature Characteristics in 1.3μm AlGaInAs-InP Strained-Multiple-Quantum-Well Lasers," IEEE Photonics Technology Letters, vol. 10, No. 12, Dec. 1998, pp. 1703-1705.

Makino, T., et al., "Maximum Output Power and Maximum Operating Temperature of Quantum Well Lasers," Appl. Phys. Lett. 71 (20), Nov. 17, 1997, pp. 2871-2873.

Wada, Hiroshi, et al., "Effects of Well Number on Temperature Characteristics in 1.3μm AlGaInAs-InP Quantum-Well Lasers," IEEE Journal of Selected Topics in Quantum Electronics, vol. 5, No. 3, May/Jun. 1999, pp. 420-427.

International Preliminary Report on Patentability from International Application No. PCT/US2005/034365, filed on Sep. 22, 2005.

Lie, Po-Hsun, et al., "1.3-μm n-type Modulation-Doped AlGaInAs/AlGaInAs Strain-Compensated Multiple-Quantum-Well Laser Diodes," IEEE Transactions on Electron Devices, vol. 49, No. 7, Jul. 2002, pp. 1129-1135.

Selmic, S.R., et al., "Single Frequency 1550-nm AlGaInAs-InP Tapered High-Power Laser With a Distributed Bragg Reflector," IEEE Photonics Technology Letters, vol. 14, No. 7, Jul. 2002, pp. 890-892.

Jain, M., et al., "Investigation of spectrally broad gain multiple-width quantum well material for colliding pulse mode-locked operation," IEE Proceedings: Optoelectronics, vol. 151, No. 3, Jun. 2004, pp. 133-137.

Walton, D.T., et al, "Resonantly pumped double clad erbium-doped fiber laser," Lasers and Electro-optics, 2004 (CLE0). Conference on San Francisco, CA, May 20-21, 2004, Piscataway, NJ, USA, IEEE, vol. 1, May 17, 2004, pp. 149-150.

Tong, Y.P., et al., "High power Cr4+:YAG laser pumped Er3+ fibre laser and amplifier," Electronics Letters, Sep. 28, 1995, vol. 31, No. 20, pp. 1741-1743.

Kaufmann, Roland, et al., "Erbium:YAG Laser Therapy of Skin Lesions," Medical Laser Application, Elsevier, NL, vol. 16, No. 4, 2001, pp. 252-263.

Limpert, J., et al., "500W continuous-wave fibre laser with excellent beam quality," Electronics Letters, IEE Stevenage, GB, vol. 39, No. 8, Apr. 17, 2003, 2 pages.

International Search Report from PCT Application No. PCT/US2005/034365, filed Sep. 22, 2005.

* cited by examiner

HIGH-POWER INFRARED SEMICONDUCTOR DIODE LIGHT EMITTING DEVICE

RELATED APPLICATIONS

This application claims the benefit of U.S. Provisional Application No. 60/612,112, filed on Sep. 23, 2004, which is incorporated herein by reference in its entirety.

BACKGROUND OF THE INVENTION

High gain, high-energy solid-state lasers that operate in the eye safe region (wavelength>1.3 micrometers) are in demand for military and commercial applications. These lasers, are typically based on crystals doped with erbium (Er) atoms that are pumped with semiconductor lasers at approximately 980 nanometers to achieve very high powers (power>3 watts). Semiconductor lasers using indium phosphide base material can also achieve laser light in this spectrum range, but at significantly lower powers (less than 1.5 Watts). There are several military requirements for such lasers. One is the augmentation of fire control systems with the capability to identify the target (Target ID) using laser radar (LADAR) imaging techniques. Another is the development of ultra-high power lasers for improved missile defense systems. Commercial applications of eye safe lasers include the development of free space communication nodes in conventional fiber optic networks and laser cutting/welding systems for manufacturing. Emerging medical applications require high-power multi-mode lasers in the spectral range from 1310 nm to 1600 nm. Within this wavelengths range, light is absorbed by targeted tissues for elimination of skin wrinkles, acne, and top-skin (for skin resurfacing). In the cases of acne and wrinkle reduction, the spectral band near the water absorption peak is ideally suited to absorb energy in the targeted areas and depths within the skin. This allows for direct destruction of p-acne and old collagen cells, prompting the body to build new, healthier skin tissue.

The Er-doped crystals have a number of absorption bands located between the visible and the near infrared spectral regions. Currently, such Er-based lasers are pumped by semiconductor diode sources operating at 0.98 micrometers (µm). Since the eye-safe lasers operate at 1.5 microns and are not 100% efficient, the difference in energy between pump beam and laser emission gives rise to heat within the laser medium. Consequently, thermal management becomes a critical issue in developing high power, eye-safe, solid-state lasers, particularly for applications that are sensitive to power dissipation, system footprint, and supporting facilities such as cooling and ventilation. Diode sources operating within the spectral ranges of either 1.47-1.48 or 1.53-1.54 microns would provide much more efficient pumping of the Er-doped crystals. This would lead to higher energy, higher gain operation with minimal energy loss to the host medium. The predominance of 0.98 micron diode sources in erbium-doped fiber optic amplifiers for telecommunication applications is due to the requirement that optical fiber amplifiers operate in single mode fiber. Many high power applications, however, are not constrained to single mode operation.

Conventional laser diode designs for infrared wavelengths, 1300 to 1600 nanometers (nm), use indium phosphide (InP) based materials with indium gallium arsenide phosphide (InGaAsP) doped quantum well structures. This structure is commonly used for high-frequency optical communications lasers that operate at low powers, less than 25 milliWatts (mW). Unfortunately, this common structure suffers from very poor efficiency and low output power, which are caused by poor electron and hole confinement, lower thermal conductivity of InP, and the difficulty of effective thermal management throughout the laser chip itself. The poor electron and hole confinement permits electron-carrier leakage around the quantum well structure, especially as the laser increases in optical power and resulting heat-load. This electron leakage converts directly into thermal energy without contributing to the optical output, and the additional thermal energy increases the chip temperature, which promotes further electron leakage. This cycle escalates very quickly such that only low optical powers are achieved before the laser reaches the thermal limit, whereby the optical energy decreases with additional electrical current. This limitation is called "thermal rollover".

Conventional laser diode designs for telecommunications applications at infrared wavelengths are further typically optimized for low electrical power dissipation, low threshold current, and high modulation bandwidth along with a single output optical mode at relatively modest powers. This is because telecommunications applications require lasers with high gain and short optical cavity lengths. The requirement for high gain constrains the device design to a multiplicity of quantum wells, in the range of four to seven to reach the requirements of a low threshold current and sufficient optical gain for the short cavity length. The short cavity length also results in a higher active layer operating temperature for a given current. As a result the maximum output power before thermal runaway is constrained to low levels.

SUMMARY OF THE INVENTION

Although the technology of InP based pump lasers for solid-state Er-doped amplifiers is to some extent based upon the 1.3 micron telecommunications laser diode technology, there are significant differences in the requirements for telecommunication applications that preclude obtaining high power levels and those differences represent the basis of this invention.

The present invention is directed to high power diode pump lasers operating in the spectral ranges of 1.30 to 1.61 micrometers (µm). These lasers are optimized to maximize output power before thermal rollover, rather than low threshold and low temperature sensitivity as required for telecommunications applications. They are also capable of multi-mode operation, which is desirable for many applications, especially when the solid state lasers/amplifiers themselves operate in multimode. This is in contrast to the conventional requirement for single mode operation for long haul telecommunication fiber optic amplifiers.

The invention is a semiconductor laser diode using aluminum gallium indium arsenide, gallium indium arsenide phosphide, indium phosphide, (AlGaInAs/GaInAsP/InP) material system and related combinations. Both the design of the active layer and the design of the optical cavity are optimized to minimize the temperature rise of the active region and to minimize the effects of elevated active layer temperature on the laser efficiency. The result is a high output power semiconductor laser for the wavelengths between 1.30 and 1.61 micrometers. The output power exceeds that exhibited by telecommunication lasers, which are required to have high modulation speeds at the expense of output power.

In one embodiment, the active layer of the inventive device is a strain compensated multiquantum well structure comprising an intraplanar compressively strained AlGaInAs well and a tensile strained AlGaInAs barrier layer. The thickness of the quantum well is 7 nanometers (nm) or less. The strain is chosen to maximize the conduction band discontinuity while still staying below the critical thickness limit to preclude dislocation formation, so that at high operating temperatures electrons are not lost to the confinement layer due to thermal emission. The width of the well is adjusted to achieve the desired operating wavelength within the constraints of the critical layer thickness.

The active layer is positioned within the center of an optical confinement layer of either the step index type or the graded index type separate confinement heterostructure (GRIN-SCH). An InP layer on each side forms the optical cladding layer for the optical confinement structure and the multi quantum well (MQW) active layer. Lateral optical confinement is provided for by either a buried heterostructure or a ridge waveguide structure.

The device is preferably of the vertical current injection type with the semiconductor layers of the SCH and cladding doped p-type, and the other set of the SCH and cladding doped n-type. Lateral current confinement is achieved by either buried stripe geometry, or a ridge waveguide of raised ridge or dual trench formation. An alternative combination is implant isolation, or mesa isolation, whereby oxide depositions confine the current to the central region of the lateral optical confinement structure.

Another aspect of the invention is the selection of the number of quantum wells in the active layer so as to minimize the thermal power dissipation density in the active layer, combined with a longer cavity length and cavity width to achieve sufficient gain so that a high optical output power is obtained. Because the area of the junction is larger, the thermal resistance is reduced, thereby resulting in a lower junction temperature for the laser operation at a given output power.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
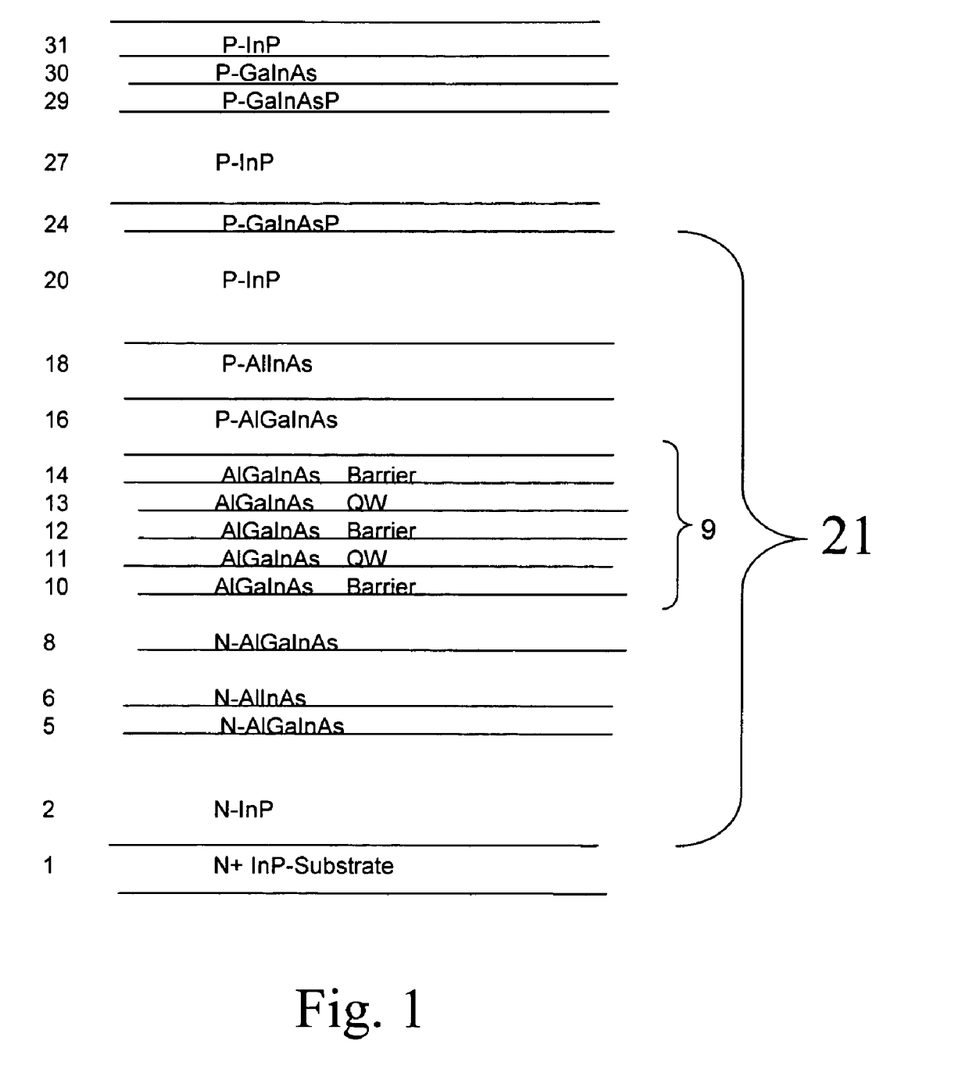
FIG. 1 is schematic side cross sectional view showing the epitaxial layer structure according to the present invention.

FIG. 1 shows the layer structure of a semiconductor light emitting device that has been constructed according to the principles of the present invention.

Specifically, a listing of the epitaxial structure shown. It was fabricated or prepared using conventional III-V compound semiconductor epitaxial growth techniques such as metal organic chemical vapor deposition OMCVD (also referred to as MOCVD) and molecular beam epitaxy (MBE). The starting substrate 1 is n-type InP, on to which the sequence of layers is epitaxially grown using known methods.

Beginning from the substrate 1, a 1 micrometer thick n+InP lower cladding layer 2 with a silicon (Si) doping concentration of $3 \times 10^{18}$ cm$^{-3}$ is grown followed by a transition region 15 nm thick of lattice matched, graded $(Al_{0.68}Ga_{0.32})_{0.47}In_{0.53}As$ to $Al_{0.48}In_{0.52}As$ 5-6 into the separate confinement heterostructure (SCH) layers 6-18. Next is the lower graded-index (GRIN) layer 8, which is 45 nm thick beginning with $Al_{0.48}In_{0.52}As$ and ending with $(Al_{0.59}Ga_{0.41})_{0.47}In_{0.53}As$. The silicon doping concentration gradually decreases from the n-type lower cladding 2 through the transition layers 5-6 to the lower GRIN layer 8 where the silicon doping concentration reaches $5 \times 10^{16}$ cm$^{-3}$.

The undoped laser active layer 9 has a set of compressively strained AlGaInAs quantum wells 11 and 13, which are confined on each side by AlGaInAs barrier layers 10 12 14 under tensile strain such that the strains compensate each other and the critical thickness for dislocations is neutralized. Here, two quantum wells 11 13 are shown each having a well thickness of 7 nm. The barrier layer thicknesses are 6 nm, 9 nm, and 5 nm for layers 10, 12, and 14, respectively.

Next the upper GRIN separate confinement layer (GRIN-SCH) 16, which is 45 nm thick beginning with $(Al_{0.59}Ga_{0.41})_{0.47}In_{0.53}As$ and ending with an interface layer of $Al_{0.48}In_{0.52}As$ 18, which is grown on top of the laser active layer 9. Included in layer 18 is an additional layer of 5 nm of $Al_{0.48}In_{0.52}As$. The p-type Zn doping concentration is gradually increased from $5 \times 10^{16}$ cm$^{-3}$ as growth proceeds toward the completion of layer 18, where the concentration reaches $1 \times 10^{17}$ cm$^{-3}$. Alternatively, a step index separate confinement heterostructure (SISCH) could be used in place of the GRIN-SCH as confinement about the active layer 9.

Above the GRIN layer 16-18 is grown the upper cladding layer 20 of 1.5 micrometer thick p-type InP Zn-doped at a concentration of $1 \times 10^{17}$ cm$^{-3}$. The layers 16, 18, and 20 mirror the lower layers of 6, 5, and 2 in optical index profile and form the laser waveguide structure 21 about the active layer 9.

Low doping of p cladding good for optical transmission. This makes for lower crystal dislocations and optical scattering.

Above the upper cladding layer 20 are the p-ohmic contact layers 27-31. Between the cladding layer 20 and the contact layers 27-31, a 20 nm thick etch stop layer of p-$Ga_{0.15}In_{0.85}As_{0.33}P_{0.67}$ 24 is grown in order to provide a controlled stopping depth for etching the ridge waveguide during the laser processing. Next a 1 micrometer thick p-InP layer 27 Zn-doped at a concentration of $4\times10^{17}$ cm$^{-3}$ is grown followed by a p-type $Ga_{0.29}In_{0.71}As_{0.62}P_{0.38}$ 29 Zn-doped at $2\times10^{18}$ cm$^{-3}$ graded to $1\times10^{19}$ cm$^{-3}$ Zn-doped $Ga_{0.47}In_{0.53}As$ 30, which will be the ohmic contact formation layer during laser processing. Finally, a capping layer of p-InP 31 Zn-doped at $1\times10^{18}$ cm$^{-3}$ is grown to complete the laser layer structure.

The detailed doping levels described are the preferred embodiment, but a range from 25% less to 50% more would be acceptable. The heavier doping densities above $1\times10^{18}$ cm$^{-3}$ can range higher by a factor of two to three as an acceptable range, as low electrical resistance is desired from these layers.

The layer thicknesses set forth above are the preferred embodiment, but a variation or 10% more or less is acceptable.

Consider now the quantum well dimensions and number for the preferred high-power application. Prior work has focused on lasers that required sufficient modulation bandwidth for telecommunications data transmission, which favored single mode short resonator cavity lengths such that the electrical impedance of the device is well matched for high-speed operation. For high optical output power, longer cavities are preferred as will be discussed below regarding heat dissipation. Secondly, good electron confinement to the quantum well with barriers that are significantly higher than the thermal voltage or the expected non-thermal energy distribution of the electron energies within the junction active area is necessary.

Figure 5:
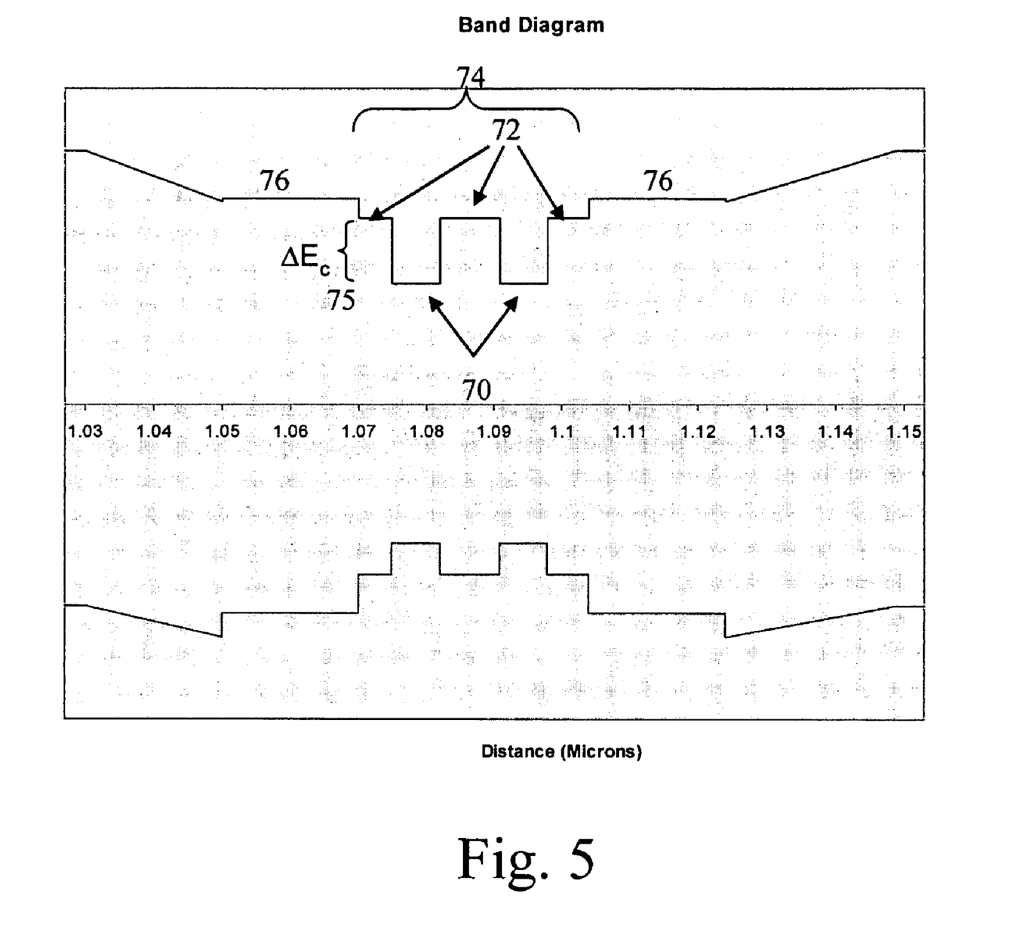
FIG. 5 are plots showing the conduction band and valence band diagrams in the absence of band bending due to doping effects, according to the present invention.

FIG. 5 shows the active layer band diagram schematically. Here, two quantum wells 70 are shown. In the strain compensated case of compressively strained AlGaInAs wells, the barrier layers 72 are under tensile strain, with the strain and thickness planned to sum to zero stress outside of the active layer well structure 74. The outside AlGaInAs layers 76 are latticed-matched to the InP lattice constant.

Table 1 shows examples of the parameters and desired emission wavelength of the present invention.

The important laser characteristics can be separated into two main requirements. These are the temperature behavior of the electron confinement and the gain characteristics of the quantum well structure 74. Considering the electron confinement first, the development of strain compensated AlGaInAs quantum well has been reported by C. E. Zah, R. Bhat, B. N. Pathak, F. Favire, W. Lin, M. C. Wang, N. C. Andreadakis, D. M. Hwang, M. A. Koza, T.-P. Lee, Z. Wang, D. Darby, D. Flanders, and J. J. Hsieh, "High-performance uncooled 1.3-_m AlGaInAs/InP strained-layer quantum-well lasers for subscriber loop applications," IEEE J. Quantum Electron., vol. 30, pp. 511-522, 1994. This was used for lasers with reduced temperature sensitivity. The use of strained compensated AlGaInAs wells and barriers increased the energy barrier $\Delta E_c$, 75 between the electron ground state energy of the well and the top of the barrier.

Here the laser is optimized for high power operation near thermal rollover where the junction temperatures are highest. The required pump wavelengths of solid state lasers permit the development of an acceptable conduction band discontinuity within the limits of strained AlGaInAs on InP as evidenced by the calculated conduction band discontinuity, $\Delta E_c$, shown in table 1, from Zah, et al. article. Even at an active layer temperature of 150 deg. C., the thermal voltage, 37 meV, is one quarter of the barrier discontinuity. Since the electron energy distributions are Boltzmann-like far from the Fermi level, the electrons are well confined in this design. Therefore, a variation in the AlGaInAs alloy compositions described above are allowable within the constraints of the requirement for electron confinement, although for high power operation, a minimum barrier height of 120 meV is required and even larger barriers of 200 meV are also acceptable.

In the present embodiment, a range of 150-200 meV is preferred for the barriers. The well thickness of 7 nm provides a balance between quantum well gain requirements and the reduction of the barrier height from tighter confinement. The gain increases and threshold current density decreases with decreasing well thickness due to the increasing energy separation of the upper electron levels in well (n=2, etc.); see for example U.S. Pat. No. 5,920,079 to Shimizu, et al or the article by Selmic, S R; Chou, TM; Sih, J P; Kirk, J B; Mantie, A; Butler, J K; Bour, D; Evans, G A, "Design and characterization of 1.3-mu m AlGaInAs-InP multiple-quantum-well lasers," IEEE JOURNAL OF SELECTED TOPICS IN QUANTUM ELECTRONICS, vol. 7, pp. 340-349, 2001. On the other hand, narrower wells raise the ground-state energy, which decreases the electron confinement.

In the present invention, 7 nm is the preferred well width. A range between 5-8 nm can be accommodated within the requirements of low threshold current density, sufficient gain, and electron confinement. The composition of $(Al_xGa_{1-x})_{1-y}As$ in the wells and barriers, which satisfies the above requirements in the table and the conditions set forth here, are the result of calculations governed by the known relationships between the composition, bandgap, strain (or lattice-match), and the well and barrier thicknesses. These relationships and calculations can be found in the paper by Zah et al.

The number of wells (W=well number) is a key aspect of the present invention, due to its effect on the thermal power dissipation density in the active area and the length of the

| Run | Structure | Material | Bandgap(nm) | Strain(%) | Width(nm) | $\Delta E_c$(eV) |
|-----|-----------|----------|-------------|-----------|-----------|------------------|
| A | Barrier | $(Al_{0.3}Ga_{0.7})_{0.58}In_{0.42}As$ | 1094 | −0.8 | 9 | |
| | Quantum Well | $(Al_{0.32}Ga_{0.68})_{0.29}In_{0.71}As$ | 1505 | 1.2 | 7 | 0.2 |
| B | Barrier | $(Al_{0.3}Ga_{0.7})_{0.58}In_{0.42}As$ | 1094 | −0.8 | 9 | |
| | Quantum Well | $(Al_{0.46}Ga_{0.54})_{0.29}In_{0.71}As$ | 1415 | 1.2 | 7 | 0.15 |
| C | Barrier | $(Al_{0.45}Ga_{0.55})_{0.58}In_{0.42}As$ | 980 | −0.8 | 9 | |
| | Quantum Well | $(Al_{0.54}Ga_{0.46})_{0.29}In_{0.71}As$ | 1354 | 1.2 | 7 | 0.15 | device. With a low well number, say two, the laser has a lower threshold current density than a laser with five wells suitable for high speed telecom operation. The effect is that the thermal power generation density due to resistive and non-radiative recombination at threshold is lower with fewer wells; hence the device has a lower operating temperature. While the gain is also lower, this is simply accommodated by increasing the length of the device. In a longer device, the heat load is distributed over a larger area, and results in a lower junction thermal impedance to the heat sink. Therefore, the design for a high power laser requires a low number of wells. Two quantum wells is the preferred embodiment in the present design. However, a range of one to three wells is acceptable depending on the laser application design requirements.

Figure 2:
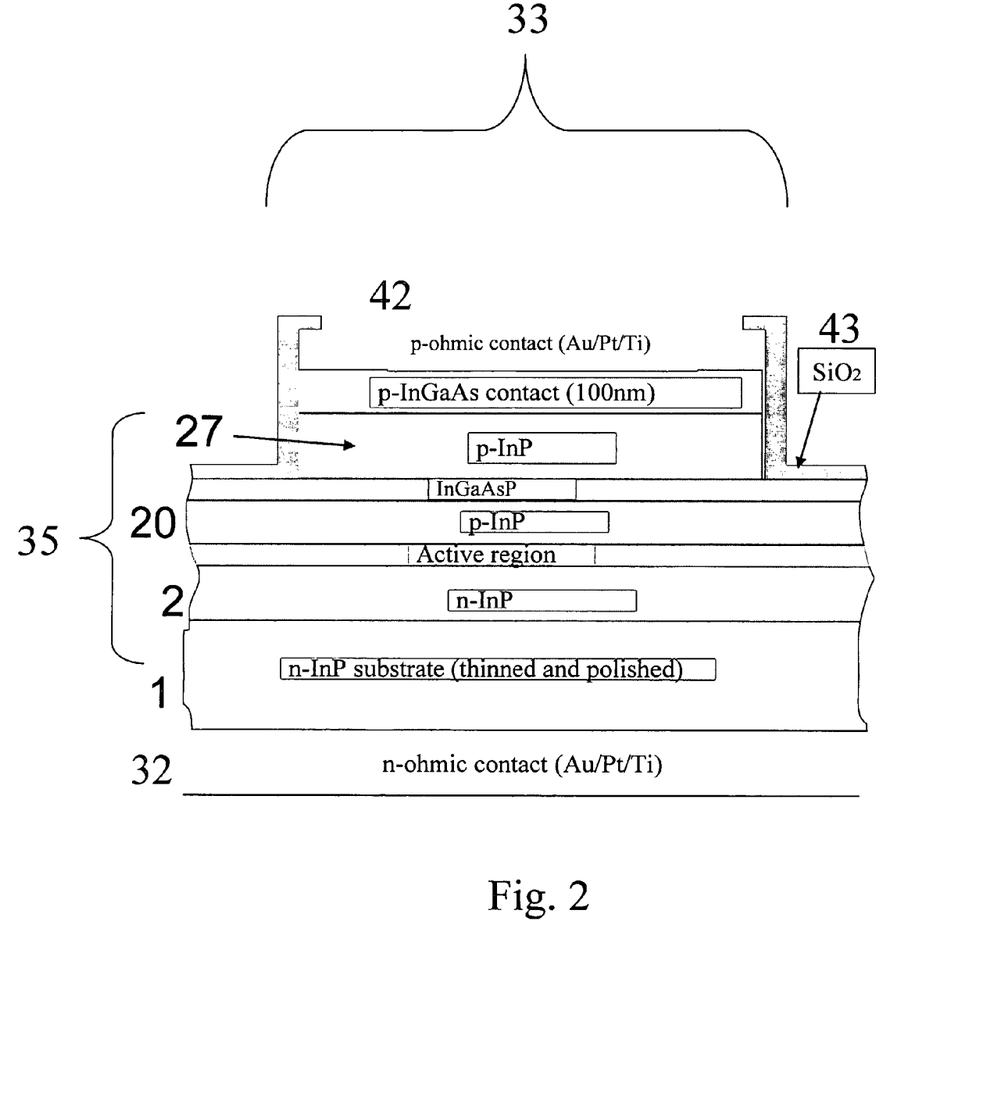
FIG. 2 is schematic lateral cross sectional view showing the structure of the inventive semiconductor device.

FIG. 2 shows the processed semiconductor light emitting device, laser structure, which is fabricated from the epitaxial layer structure shown in FIG. 1. The structure shows a ridge waveguide type laser, with an index guided lateral waveguide confinement structure 33. Alternatively, the ridge can be etched through the active layer forming an air-clad lateral confinement structure. A third approach is to use impurity induced disordering (IID) to selectively dislocate the crystal structure outside of the waveguide region. The lateral waveguide structure in either of these cases supports multimode optical operation in the lateral plane, in the preferred embodiment. The backside of the n-type InP substrate 1 is thinned using grinding and polishing procedures in order to reduce the ohmic series resistance and thereby ohmic heating of the substrate. The n-type ohmic contact 32 is formed on the backside of the thinned substrate.

In other embodiments, lateral electron and optical confinement is maintained using impurity induced disordering.

The vertical optical waveguide confinement region 35 is shown, preferably comprising again the lower n-type cladding 2 and part of the thinned substrate 1, while the upper cladding is formed from the p-type InP layer 20 and the p-type InP layer 27, which lies within the ridge structure. The thickness of layer 27 is chosen to minimize the thermal impedance through the layer while in combination with the thickness of 38, still being of sufficient total optical thickness (layer 20+Layer 27) to provide confinement to a single vertical mode. The thickness of layer 27 also determines the lateral optical confinement in combination with the height of the ridge waveguide structure. The preferred thickness of layer 27 is 1.0 micrometers of InP for operation in the 1.3 to 1.55 band. A range of 0.9 to 1.1 microns maintains excellent performance, by providing sufficient optical confinement to minimize optical losses and minimize the thermal impedance based on the required wavelength of operation. The full range of 0.7 to 5.0 microns will provide good performance, however. Above the optical waveguide structure is the p-ohmic contact metal 42. The ridge sidewalls and the top surface of the device wafer are coated with an insulator 43 such as $SiO_2$.

Figure 3:
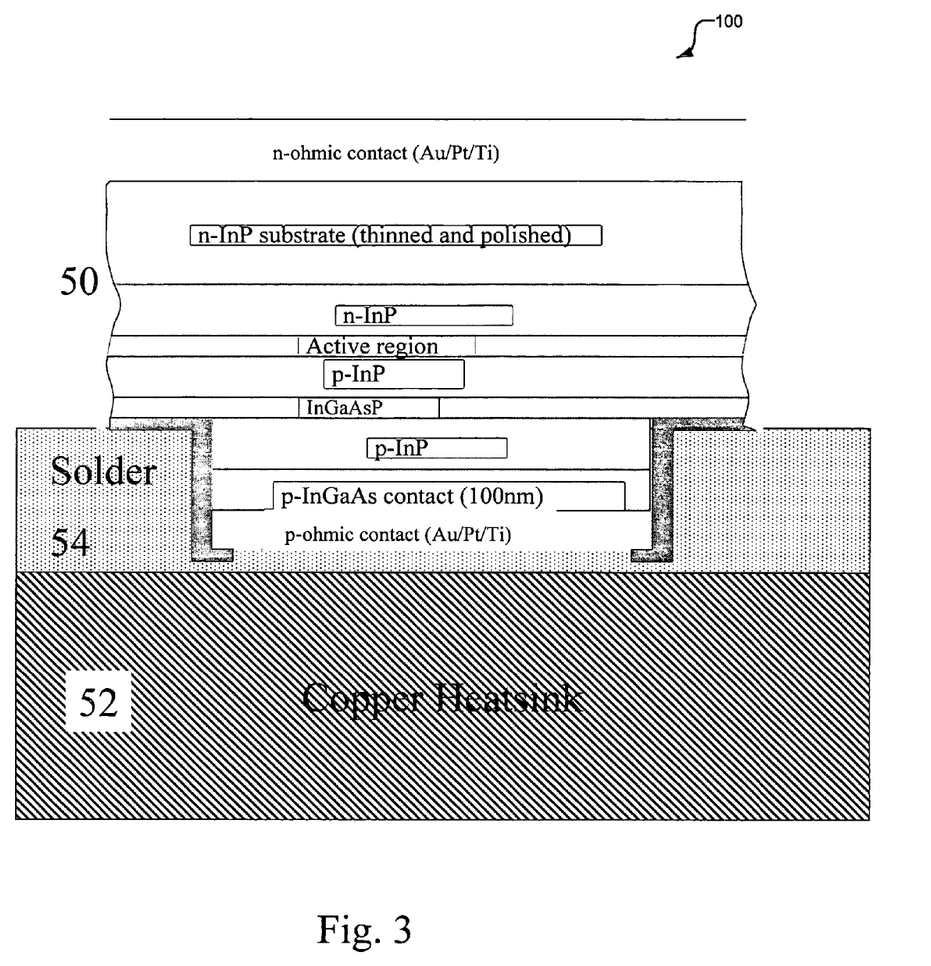
FIG. 3 is schematic lateral cross sectional view showing the structure of the semiconductor device mounted p-side down on a copper heat sink using solder, according to the present invention.

The purpose of the insulator 43 is to avoid shorting out the junction and to confine the current to pass through the active area under the ridge after the device is mounted p-side down, as shown in FIG. 3. The thinned laser chip 50, after die separation and facet cleaving using methods familiar to those in the field, is attached to a copper heat sink 52 using a low temperature solder 54 to form the semiconductor light emitting device 100. This mounting configuration combined with the minimized thickness of layer 27 results in a lowered device active area temperature and is key aspect of the present invention, enabling increased laser output power at higher current densities compared to previous devices which experience thermal roll-over at lower current densities due to increased active area temperatures.

In one embodiment, the length of the laser chip length is between facet mirrors is between 1.0 and 2.0 millimeters. The laser chip aperture width is between 60 and 150 micrometers. These device parameter ranges optimize the laser for good thermal and electrical efficiency by spreading out the electron injection and thermal dissipation over a large area, but not so large that these gains are offset by internal optical losses and threshold inefficiency. This enables the device to reach high output powers.

Noteworthy of this mounting configuration is that for multimode operation, direct bonding of the p-contact to the package or submount heat sink is feasible, in contrast to the case for single-mode telecommunications lasers, which are sensitive to mounting induced stress and require additional layers and methods to mitigate the effects of stress resulting from p-side down mounting on the device performance. The present mounting method is lower cost, higher yield, and provides a lower active layer to heat sink thermal impedance than typical telecom laser mounting practice.

The design attribute of 1-3 quantum wells in this invention must be matched to the most appropriate laser cavity length and aperture width to maximize the efficiency and output power of the laser. Cavity lengths in the range of 1.0 millimeters (mm) to 2.0 mm provide optimum results when combined with aperture widths between 60 to 150 micrometers.

Figure 4:
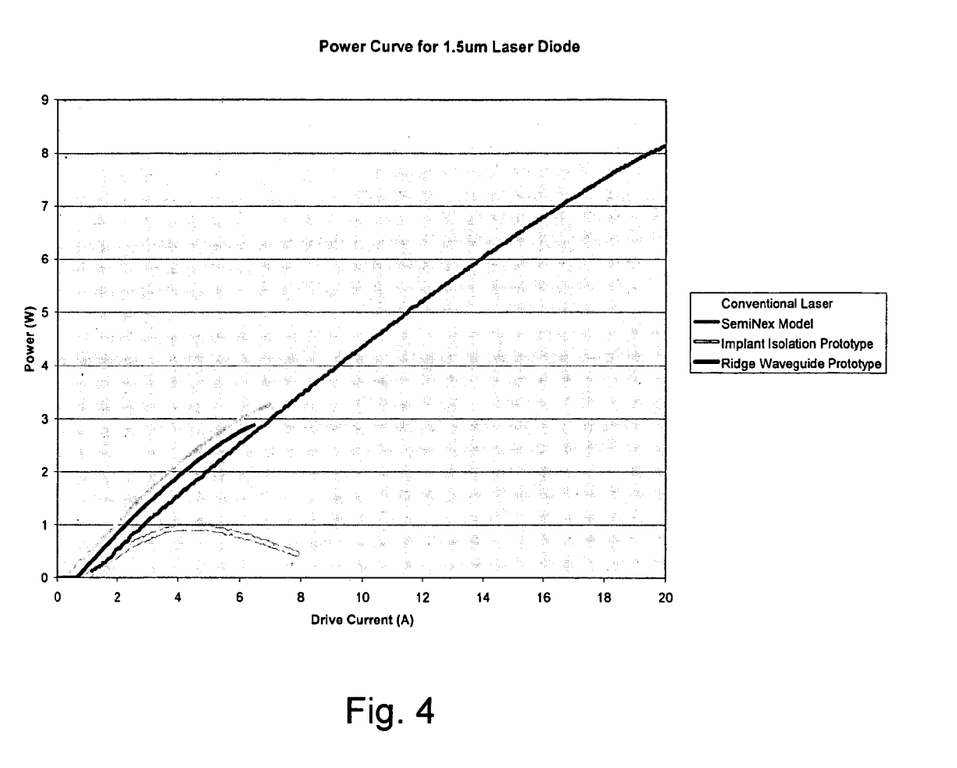
FIG. 4 is a plot of optical power in Watts as a function of drive current in Amperes showing actual inventive prototype results with two different processing techniques for optical and electrical confinement: implant isolation and ridge waveguide isolation; these results are compared against a conventional laser.

FIG. 4 shows a calculated comparison of the present invention to typical prior art. As indicated, the new thermal design combined with the active layer design described above provides a six-fold improvement in the output power of the laser before thermal rollover.

Figure 6:
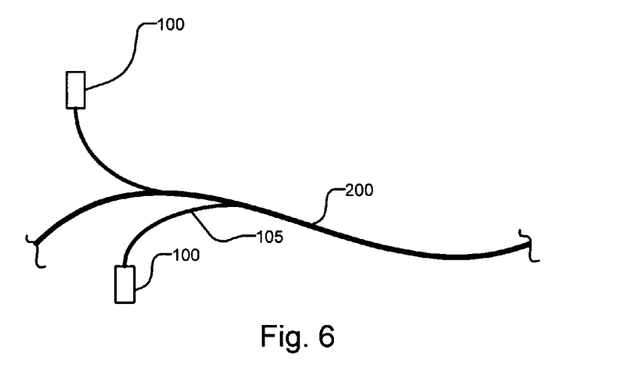
FIG. 6 is a schematic diagram illustrating one application for the semiconductor light emitting device according to the present invention.

FIG. 6 is a schematic diagram illustrating one application for the semiconductor light emitting device 100.

Specifically, the laser devices 100 are used as pumps for a rare-earth (erbium) doped waveguide amplifier or laser 200. Preferably, the laser pumps 100 emit light in multiple spatial modes and are thus coupled to the cladding of the waveguide 200 via multi spatial mode fibers 105.

In one embodiment, the waveguide 200 is an erbium doped fiber, and specifically multi spatial mode fiber that has a core diameter of greater than 50 micrometers. In another embodiment, the waveguide is a planar waveguide device that is doped with erbium. This configuration is also preferably multi spatial mode for high power.

Uses for the amplifier 200 include the generation of light to interact with the human dermal and/or epidermal structures, for free-space optical communications, and for the destruction of cancer cells.

Figure 7:
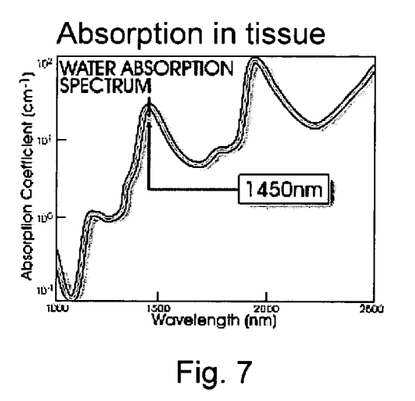
FIG. 7 and FIG. 8 are plots of absorption or attenuation as a function of wavelength illustrating that wavelengths this inventive laser are highly absorbed by (or attenuated by) water but not optical fiber.
Figure 8:
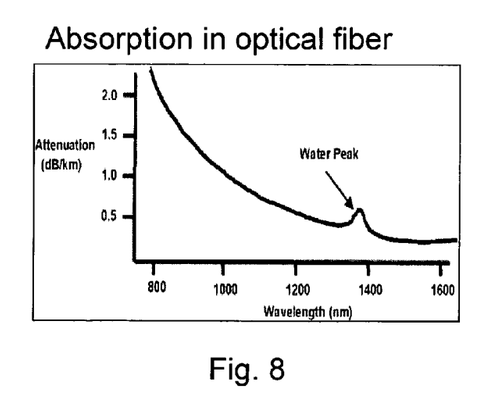

FIG. 7 and FIG. 8 illustrate that wavelengths this invention are highly absorbed by (or attenuated by) water. This makes inventive device 100 well suited for medical applications where absorption is beneficial. These include applications on the skin. Some benefits of skin application include reduction of acne, reduction of skin wrinkle, and overall improvement in skin texture and health. Invention can also reduce tumors when applied.

FIG. 8 shows that at wavelengths between 1530 and 1650 nm, we find this invention is useful because attenuation is low. This is beneficial in using inventive device for transmitting communication signals through air and space.

Figure 9:
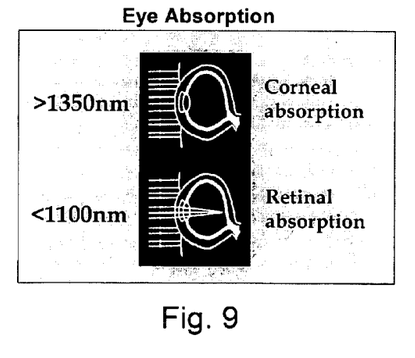
FIG. 9 shows an application for treatment of eye cornea.

In addition, these signals are absorbed by the eye cornea instead of the retina as shown in FIG. 9. This makes signal significantly safer as the corneal absorption does not cause permanent eye damage but the retinal absorb does.

While this invention has been particularly shown and described with references to preferred embodiments thereof, it will be understood by those skilled in the art that various changes in form and details may be made therein without departing from the scope of the invention encompassed by the appended claims.

What is claimed is:

1. A semiconductor light emitting device, comprising an active region with barriers and no more than three quantum wells constructed from various ratios of aluminum, gallium, indium and arsenic with the quantum wells being sized between 5 nm and 8 nm and the conduction energy levels between barriers and the quantum wells being between 120 meV and 200 meV, wherein the active region is placed between two confining layers of opposite conductive doping where p-doped confining layers start with a concentration of $5 \times 10^{16}$ cm$^{-3}$ $-25\%/+50\%$ and increase to a final concentration of $1 \times 10^{17}$ cm$^{-3}$, $-25\%+50\%$, and a interface layer that immediately follows the p-doped confining layers has a fixed doping concentration which is between the final doping concentration of the confining layers and $1 \times 10^{18}$ cm$^{-3}$, $+300\%$.

2. A device as claimed in claim 1, further comprising a substrate and cladding layers with doping concentrations of about $1.0 \times 10^{17}$ cm$^{-3}$.

3. A device as claimed in claim 2, wherein the substrate is an indium phosphide substrate and the p-doped cladding layer is doped with zinc.

4. A device as claimed in claim 2, further comprising an aluminum indium arsenide layer between the active region and at least one of the cladding layers.

5. A device as claimed in claim 4, wherein a doping concentration of the aluminum indium arsenide layer is greater than $0.75 \times 10^{17}$ cm$^{-3}$.

6. A device as claimed in claim 4, wherein the aluminum indium arsenide layer is doped with zinc.

7. A device as claimed in claim 1, further comprising a ridge waveguide structure formed in the device.

8. A device as claimed in claim 7, wherein the ridge waveguide structure supports multiple spatial modes.

9. A device as claimed in claim 7, further comprising a heat sink, to which the ridge structure is mounted.

10. A semiconductor light emitting device, comprising an active region with barriers and no more than three quantum wells constructed from various ratios of aluminum, gallium, indium and arsenic with the quantum wells being sized between 5 nm and 8 nm and the conduction energy levels between barriers and the quantum wells being between 120 meV and 200 meV, and further comprising:
an indium phosphide substrate;
a ridge structure, being between 1.5 millimeters (mm) and 2 mm long, wherein height of the ridge structure is defined by an indium gallium arsenide phosphide etch stop layer;
an upper cladding layer below the etch stop layer, the upper cladding layer not being etched and being continuous, extending across a width and length of the device; and
a lower cladding layer under the active layer, wherein at least one of the upper and lower cladding layers is between 0.7 to 5.0 micrometers thick.

11. A device as claimed in claim 10, wherein a laser chip aperture width is between 60 and 150 micrometers.

12. A device as claimed in claim 10, wherein a thickness between the active layer and the etch stop layer is 1.54 micrometers +/−10%.

13. A semiconductor light emitting device, comprising an active region with barriers and no more than three quantum wells constructed from various ratios of aluminum, gallium, indium and arsenic with the quantum wells being sized between 5 nm and 8 nm and the conduction energy levels between barriers and the quantum wells being between 120 meV and 200 meV, and further comprising:
a heatsink;
a laser die mounted p-side down on the heat sink with a bonding metal, having a ridge structure with a height of less than 5 micrometers and penetrating into the bonding metal by a distance greater than the ridge height with the bonding metal contacting the ridge surface and at least two of its sides,
wherein the active area of the laser die is separated from the bonding metal by a distance of 1.54 micrometers +/−10%.

14. A semiconductor light emitting device, comprising an active region with barriers and no more than three quantum wells constructed from various ratios of aluminum, gallium, indium and arsenic with the quantum wells being sized between 5 nm and 8 nm and the conduction energy levels between barriers and the quantum wells being between 120 meV and 200 meV, and further comprising ohmic contact layers of an InP layer which is p-type doped at $1 \times 10^{18}$ cm$^{-3}$, $-25\%/+50\%$ on an InGaAs layer which is doped at $1 \times 10^{19}$ cm$^{-3}$, $-0\%/+300\%$ which is grown upon a graded layer which is graded from $2 \times 10^{18}$ cm$^{-3}$, $-0\%/+300\%$ to $1 \times 10^{19}$ cm$^{-3}$, $-0\%/300\%$, which is grown upon a InP layer having a thickness between 0.7 μm and 5 μm, +/−10% and is p-type doped at $4 \times 10^{17}$ cm$^{-3}$, $-25\%/+50\%$, and is grown upon an etch stop layer comprising GaInAsP.

15. A device as claimed in claim 14, further comprising a metal or stack of metal layers on the ohmic contact layers.

16. A device as claimed in claim 14, further including cladding layers.

17. A device as claimed in claim 14, wherein a substrate is an indium phosphide substrate and the cladding layers are doped with zinc.

18. A device as claimed in claim 14, further comprising a ridge waveguide structure formed in the device.

19. A device as claimed in claim 18, wherein the ridge waveguide structure supports multiple spatial modes.

20. A device as claimed in claim 14, further comprising an active layer having 3 or less quantum wells.

21. A device as claimed in claim 14, wherein the InP is removed exposing the InGaAs layer below.

22. A device as claimed in claim 14, further comprising graded index confining layers.

23. A device as claimed in claim 1, wherein the device emits light in the spectral range of 1.30 micrometers and 1.6 micrometers.

24. A device as claimed in claim 1, wherein the barriers are of different thicknesses ranging between 5 nanometers and 9 nanometers.

* * * * *